Figure 2:
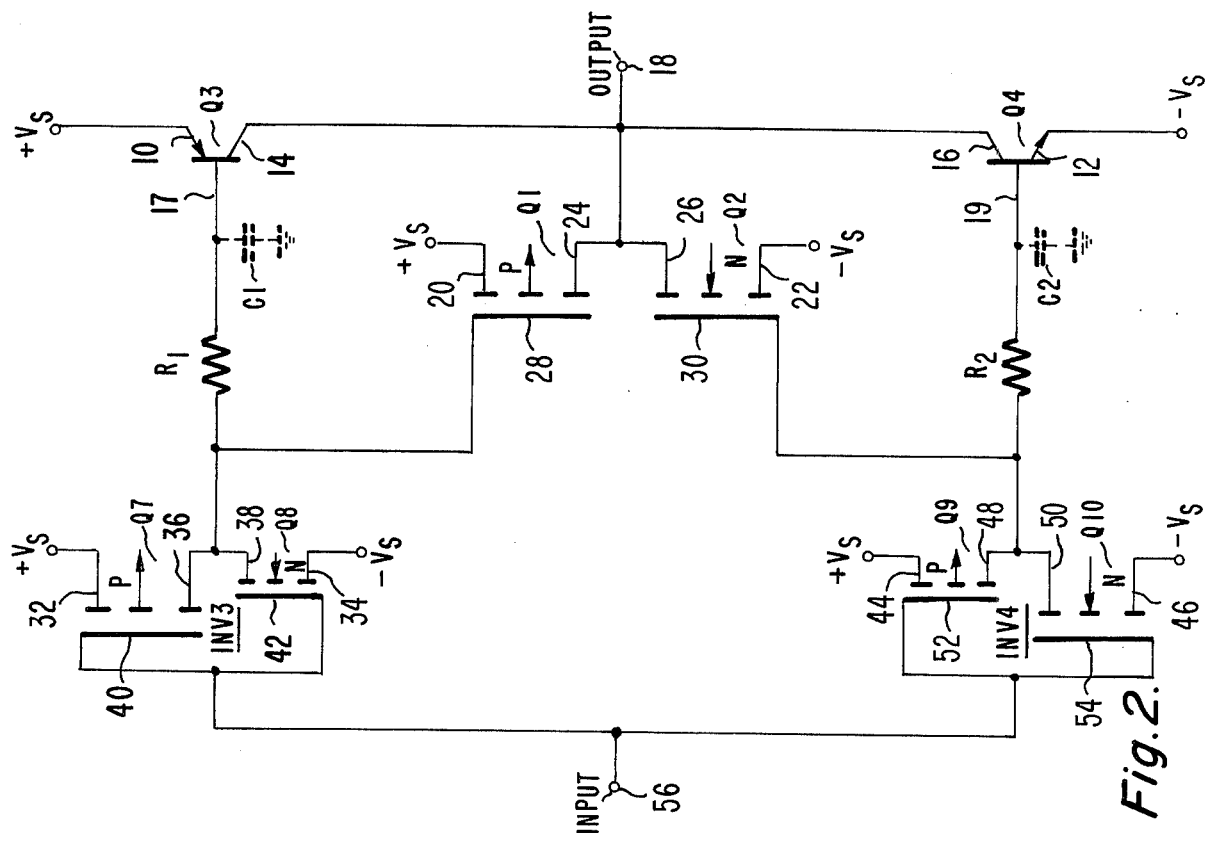

United States Patent [19]

Morton

[11] 4,103,188

[45] Jul. 25, 1978

[54] COMPLEMENTARY-SYMMETRY AMPLIFIER

[75] Inventor: George Ira Morton, Belle Mead, N.J.

[73] Assignee: RCA Corporation, New York, N.Y.

[21] Appl. No.: 826,694

[22] Filed: Aug. 22, 1977

[51] Int. Cl.$^2$ ............................................. H03K 17/60
[52] U.S. Cl. .................................... 307/251; 307/255; 307/300; 330/264; 330/300
[58] Field of Search ................ 330/264, 300; 307/251, 307/255, 300

[56] References Cited

U.S. PATENT DOCUMENTS 3,631,528   12/1971   Green .................................... 307/251

Primary Examiner—James B. Mullins
Attorney, Agent, or Firm—H. Christoffersen; Allen LeRoy Limberg; Lawrence P. Benjamin

[57] ABSTRACT

A complementary-symmetry amplifier is described, wherein a CMOS inverter has its P-channel MOSFET paralleled by the emitter-to-collector path of a simultaneously conductive PNP bipolar transistor and has its N-channel MOSFET paralleled by the emitter-to-collector path of a simultaneously conductive NPN bipolar transistor. The amplifier switches very rapidly due to the high transconductances of the bipolar transistors, while the MOSFET's permit the output terminal of the amplifier to swing over the full range of available supply potential.

12 Claims, 3 Drawing Figures

2

COMPLEMENTARY-SYMMETRY AMPLIFIER

The present invention relates in general to complementary-symmetry amplifiers and, more particularly, to a complementary-symmetry amplifier capable of switching over the full range of available supply potential.

The well-known Complementary-Metal-Oxide-Semiconductor (CMOS) inverter includes P-channel and N-channel enhancement-type metal-oxide-semiconductor field-effect transistors (MOSFET's) with their respective gate electrodes connected to the inverter input terminal. The channels of the P-channel and N-channel transistors are connected at their respective source electrodes to relatively positive and relatively negative sources of supply potentials and at their drain electrodes to the inverter output terminal. An input signal of sufficient amplitude, applied to the inverter input terminal, will drive one of the MOSFET's into conduction, while the other is maintained non-conductive, to clamp the inverter output terminal to one of the power supply potentials. If speed of operation is not essential, the described MOSFET inverter performs well. However, the relatively low transconductances inherently associated with the MOSFET's tend to make such an inverter slow-switching as compared to push-pull configurations using complementary-symmetry bipolar transistors. Such push-pull connections of bipolar transistors, while fast-switching, have a serious drawback in that they do not permit switching over the entire range of available operating supply potential, since a small, residual collector-to-emitter potential always appears across a bipolar transistor in saturated conduction, thus preventing the output from rising to the level of the supply potential.

The present invention is embodied in complementary-symmetry amplifiers in each of which a push-pull connection of complementary conductivity field-effect transistors parallels a push-pull connection of complementary conductivity bipolar transistors to achieve fast switching over a wider range of voltages than heretofore possible.

Figure 1:
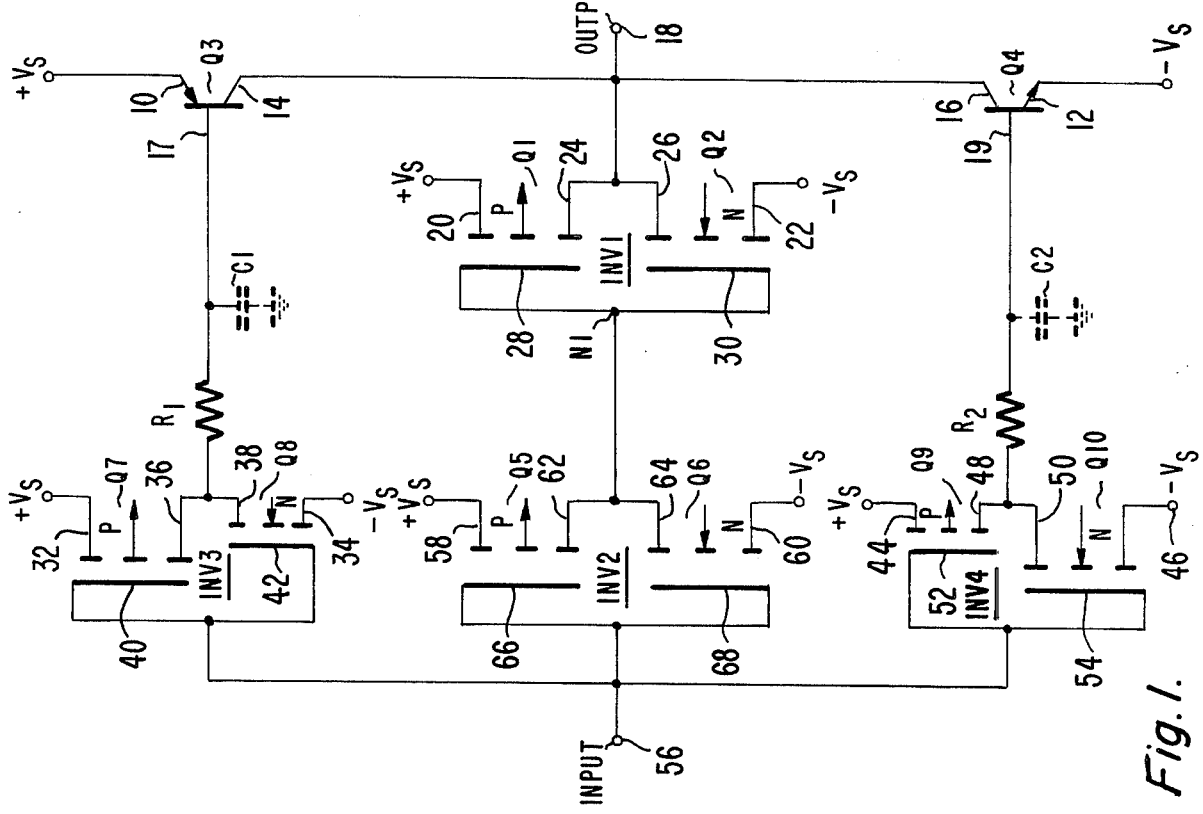
Figure 3:
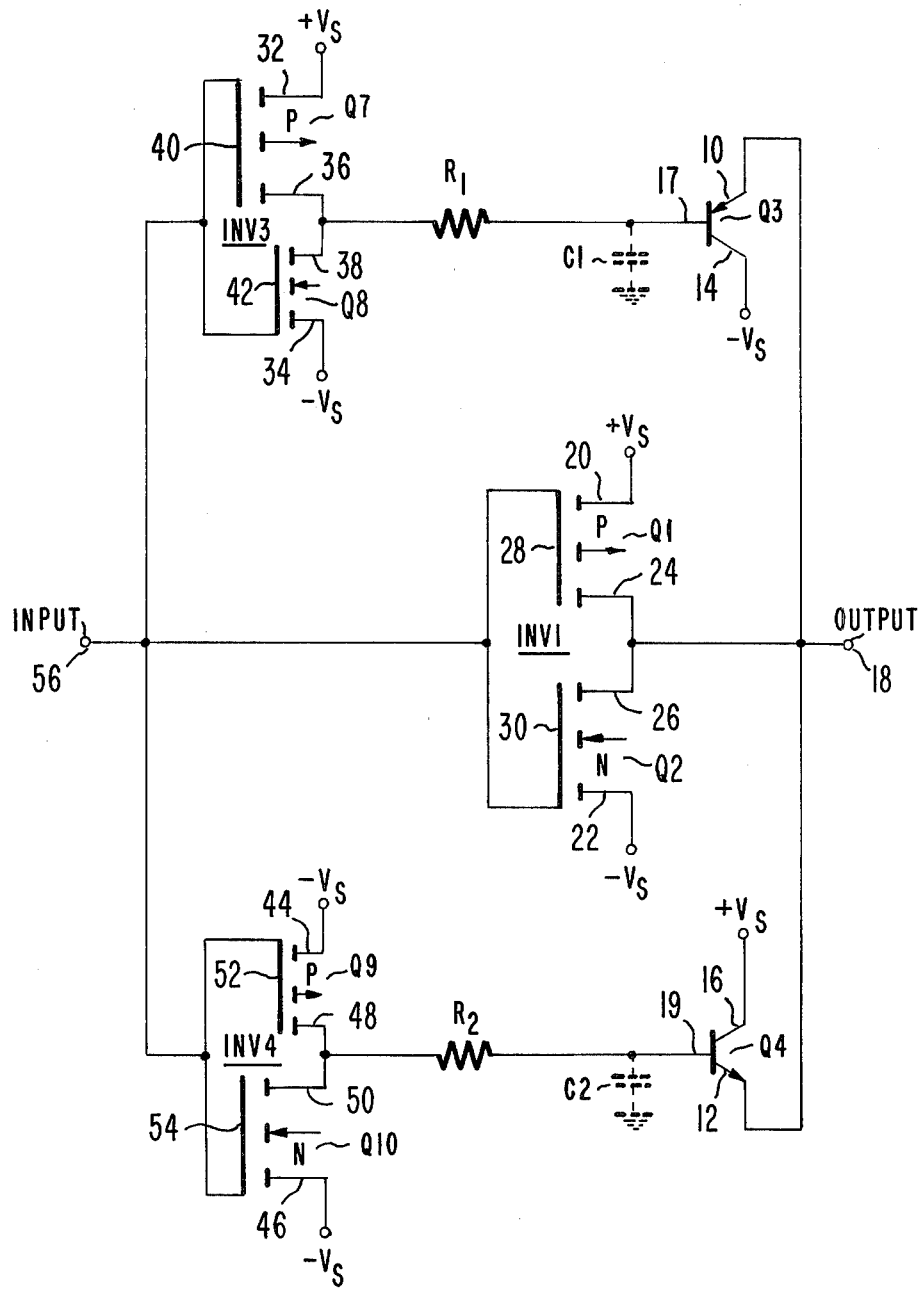

FIGS. 1, 2, and 3 are schematic diagrams of representative complementary-symmetry amplifiers, embodying the principles of the invention.

Referring now to FIG. 1, the gate electrodes 28 and 30 of P-channel MOSFET $Q_1$ and N-channel MOSFET $Q_2$ respectively are interconnected at circuit node $N_1$ to which a switching signal is applied in a manner which will be explained in greater detail below. The source electrode 20 of $Q_1$ is connected to $+V_S$, a source of relatively positive operating potential, while drain electrodes 24 and 26 of $Q_1$ and $Q_2$ are connected to OUTPUT terminal 18. To complete the connections, source electrode 22 of $Q_2$ is connected to $-V_S$, a source of relatively negative operating potential. These connections of $Q_1$ and $Q_2$ condition them to operate as a first CMOS inverter, INV1.

The channel of P-channel MOSFET $Q_1$ is now connected in parallel with the emitter-to-collector path of PNP bipolar transistor $Q_3$, a transistor of similar conductivity type, by connecting emitter electrode 10 of $Q_3$ to $+V_S$ and connecting collector electrode 14 to drain electrode 24. Similarly, the channel of N-channel MOSFET $Q_2$ is connected in parallel with the emitter-to-collector path of NPN bipolar transistor $Q_4$, a transistor of similar conductivity type, by connecting collector electrode 16 of $Q_4$ to drain electrode 26 and connecting emitter electrode 12 to $-V_S$. Substantially simultaneous conduction of $Q_1$ and $Q_3$ could be achieved by a resistive connection between node $N_1$ and the base electrode of $Q_3$, and substantially simultaneous conduction of $Q_2$ and $Q_4$ could be achieved by a similar resistive connection between node $N_1$ and the base electrode of $Q_4$. However, such configurations would tend to result in overlapping periods of conduction due to the previously known "charge storage" phenomenon associated with the base-regions of transistors switched into saturation. Owing to the high transconductance characteristic of bipolar transistors, this is likely to cause a short-circuit between $-V_S$ and $+V_S$ through $Q_3$ and $Q_4$ for a measurable period of time. The duration of the short circuit is likely to be sufficient to cause excessive heating of these transistors and could lead to their destruction. Such operation would also tend to excessively load the operating potential supplies. This short-circuiting problem may be avoided by having the input signal appearing at INPUT terminal 56 applied with longer delay to turn on $Q_3$ than to turn off $Q_4$ and vice versa.

The INPUT signal at terminal 56 is applied without lengthened delay to node $N_1$ through CMOS inverter INV2. INV2, comprising P-channel MOSFET $Q_5$ and N-channel MOSFET $Q_6$, is similar in type to $Q_1$ and $Q_2$, respectively, in CMOS inverter INV1. Gate electrodes 66 and 68 are connected to INPUT terminal 56 and source electrode 58 of $Q_5$ is connected to $+V_S$, a source of positive operating potential while drain electrodes 62 and 64 of $Q_5$ and $Q_6$ are connected to node $N_1$. To complete the connections of INV2, source electrode 60 of $Q_6$ is connected to a source of negative operating potential $+V_S$. The channel width-to-length ratios of $Q_5$ and $Q_6$ are tailored so that their drain-current-versus-source-to-gate potential characteristics match and are made large enough that CMOS inverter INV1 switches rapidly in either direction. Similarly, the channel width-to-length ratios of $Q_1$ and $Q_2$ are tailored so that their drain-current-versus-source-to-gate potential characteristics match and are made large enough that CMOS inverter INV2 switches rapidly in either direction.

INV3 comprising of a P-channel MOSFET $Q_7$ and an N-channel MOSFET $Q_8$, is connected in the circuit with source electrode 32 of transistor $Q_7$ connected to $+V_S$ and source electrode 34 of $Q_8$ connected to $-V_S$. The gate electrodes 40 and 42 of $Q_7$ and $Q_8$ are both connected to INPUT terminal 56 while drain electrodes 36 and 38 of $Q_7$ and $Q_8$ are connected together and to one end of $R_1$, the other end of which is connected to the base electrode of PNP transistor $Q_3$. Transistors $Q_7$ and $Q_8$ have channel width-to-length ratios chosen so as to produce, in one MOSFET, a relatively large-drain-current-versus-source-to-gate potential characteristics and a relatively small-drain-current-versus-source-to-gate potential characteristics in its associated FET. This facilitates $Q_3$ being switched off at a relatively rapid rate in response to a negative-going excursion of potential at input terminal 56, but permits $Q_3$ to be switched on only at a relatively slow rate in response to a positive-going excursion of potential at input terminal 56. This is due, in large measure, to the fact that the capacitance $C_1$, associated with the base of $Q_3$, is charged more rapidly to a maximum positive voltage, through the relatively high transconductance P-channel transistor $Q_7$ than it is charged to a negative voltage through the relatively low transconductance N-channel MOSFET $Q_8$.

INV4, on the other hand, comprises a P-channel MOSFET $Q_9$ and an N-channel MOSFET $Q_{10}$ that is connected in the circuit with source electrode 44 of $Q_9$ connected to $+V_S$ and source electrode 46 of $Q_{10}$ connected to $-V_S$. The gate electrodes 52 and 54 of $Q_9$ and $Q_{10}$ are both connected to input terminal 56 while drain electrodes 48 and 50 are connected together and to one end of $R_2$, the other end of which is connected to base electrode 19 of NPN transistor $Q_4$. Transistors $Q_9$ and $Q_{10}$ are tailored to have channel width-to-length ratios chosen for relatively small and relatively large drain-current-versus-source-to-gate potential characteristics, respectively. This facilitates $Q_4$ being switched off at a relatively rapid rate in response to a positive-going excursion of potential at input terminal 56, but permits $Q_4$ to be switched on only at a relatively slow rate for negative-going signals at input terminal 56. This, too results from the presence of capacitance $C_2$, associated with the base of $Q_4$, which is charged more rapidly to a maximum negative voltage through the relatively high transconductance transistor $Q_{10}$ than it is to a corresponding positive voltage by the relatively low transconductance of transistor $Q_9$.

The design of inverters INV2, INV3 and INV4 is such, then, that $Q_3$ is turned off more rapidly than $Q_4$ is turned on and that $Q_4$ is turned off more rapidly than $Q_3$ is turned on, avoiding short circuit owing to $Q_3$ and $Q_4$ being simultaneously in full conduction.

Resistor $R_1$ and resistor $R_2$ have been included to limit the base current drive available to bipolar transistors $Q_3$ and $Q_4$ when $Q_8$ and $Q_9$ respectively are conducting. Additionally, it should be obvious that $R_1$ may be replaced by a direct connection between INV3 and the base electrode of $Q_3$ while $R_2$ may be replaced by a similar direct connection between INV4 and the base electrode of $Q_4$ if the conductance of $Q_8$ and $Q_9$ respectively when switched into conduction, are made sufficiently small so as to limit the base current drive to bipolar transistors $Q_3$ and $Q_4$. The base-to-substrate capacitances $C_1$ and $C_2$ of $Q_3$ and $Q_4$ are shown in dotted form to indicate they inhere in the construction of $Q_3$ and $Q_4$.

Referring now to FIG. 2, where similar elements are similarly numbered there is shown a modification of the FIG. 1 configuration which also embodies the principles of the present invention. However, in this embodiment the need for $Q_5$ and $Q_6$ is obviated. Since inverter INV2 is eliminated, $Q_1$ and $Q_2$ no longer have their gate electrodes 28, 30 connected together and instead, gate electrode 28 of $Q_1$ is driven from the interconnected drain electrodes 36, 38 of $Q_7$ and $Q_8$ in inverter INV3. Similarly, gate electrode 30 of $Q_2$ is driven from the interconnected drain electrodes 48, 50 of $Q_9$ and $Q_{10}$ in inverter INV4. Inverter INV3 performs a similar inverter function, as between input terminal 56 and the gate electrode 28 of $Q_1$ as performed by inverter INV2 in FIG. 1 while inverter INV4 performs a similar inverter function, as between input terminal 56 and the gate electrode 30 of $Q_2$, as performed by inverter INV2 in FIG. 1. In the FIG. 2 configuration, the resistors $R_1$ and $R_2$ are utilized to prevent the clamping action of the base-emitter junctions of $Q_3$ and $Q_4$, when forward-biased and thus, unnecessarily restrict the output voltage swing of inverters INV3 and INV4 and cause insufficient gate drive to $Q_1$ and $Q_2$.

Referring now to FIG. 3, where similar elements are similarly numbered, there is shown still another embodiment of the invention, differing from the previously-described embodiments in having gate electrodes 28 and 30 of P-channel and N-channel MOSFET's $Q_1$ and $Q_2$ connected to input terminal 56 without an intervening inverter stage and in having $Q_3$ and $Q_4$ connected in common-collector rather than common-emitter configuration. Source electrode 20 of $Q_1$ is connected to $+V_S$, a source of relatively positive operating potential, while drain electrodes 24 and 26 of $Q_1$ and $Q_2$ respectively are connected together and to output terminal 18. To complete the connections of $Q_1$ and $Q_2$ to condition them to operate as a first CMOS inverter, INV1, source electrode 22 of $Q_2$ is connected to $-V_S$, a source of relatively negative operating potential.

$Q_3$, a PNP bipolar transistor, has collector electrode 14 connected to $-V_S$ and has base electrode 17 connected to drain electrodes 36 and 38 of $Q_7$ and $Q_8$ through current limiting resistor $R_1$. $Q_4$, an NPN bipolar transistor, has collector electrode 16 connected to $+V_S$ and has base electrode 19 connected to drains 48 and 50 of $Q_9$ and $Q_{10}$ through limiting resistor $R_2$. Emitter electrodes 10 and 12 of bipolar transistors $Q_3$ and $Q_4$ respectively are connected together and to output terminal 18 as are drain electrodes 24 and 26 of MOSFET's $Q_1$ and $Q_2$.

When a signal appears at input terminal 56 that swings negative, P-channel MOSFET's $Q_1$, $Q_7$ and $Q_9$ become conductive to pull the potentials at their respective drain electrodes to the $+V_S$ potential at their respective source electrodes, and N-channel MOSFET's $Q_2$, $Q_8$ and $Q_{10}$ are biased for non-conduction. During periods of conduction of $Q_9$, a positive potential is applied to the base electrode of NPN bipolar transistor $Q_4$ and, due to the emitter follower action of $Q_4$, which has its emitter-to-collector path in parallel with the channel of MOSFET $Q_1$, aids $Q_1$ in pulling output terminal 18 towards $+V_S$ during the transition period to $+V_S$. The conduction of MOSFET $Q_7$ causes cut off base current drive to be applied to $Q_3$ to clamp base electrode 17 to $+V_S$ and render bipolar transistor $Q_3$ as non-conductive.

When a signal at input terminal 56 swings positive, N-channel MOSFET's $Q_2$, $Q_8$ and $Q_{10}$ become conductive to pull the potentials at their respective drain electrodes to the $-V_S$ potential at their respective source electrodes, and P-channel MOSFET's $Q_1$, $Q_7$ and $Q_9$ are biased for non-conduction. During periods of conduction of $Q_8$, a negative base potential is applied to PNP bipolar transistor $Q_3$, and due to the emitter follower action of $Q_3$, which has its emitter-to-collector path in parallel with the channel of MOSFET $Q_2$, aids $Q_2$ in pulling output terminal 18 towards $-V_S$ during the transition period to $-V_S$. The conduction of MOSFET $Q_{10}$ causes cut off base current drive to be applied to $Q_4$ to clamp its base electrode to $-V_S$ and render bipolar transistor $Q_4$ as non-conductive.

The signal appearing at input terminal 56 may be a voltage that is symmetrical with respect to its rise and fall time as derived, for example, from a matched inverter pair, having characteristics similar to that of INV1.

What is claimed is:
1. A complementary-symmetry amplifier comprising:
a source of positive supply voltage;
a source of negative supply voltage;
an input signal terminal;
an output signal terminal;
first and second bipolar transistors of opposite type conductivity, each transistor having first and sec- ond electrodes with a principal conduction path therebetween and having a base electrode, the first electrodes of the first and second bipolar transistor being connected respectively to the source of positive supply voltage and to the source of negative supply voltage, the second electrodes of the first and second bipolar transistors being connected to the output signal terminal;

first and second inverter means coupling the input signal terminal to respective base electrodes of the bipolar transistors; the first inverter means having an input means connected to the input signal terminal and an output means coupling the output of the first inverter to the base electrode of the first bipolar transistor; and the second inverter means having an input means connected to the input signal terminal and an output means coupling the output of the second inverter to the base electrode of the second bipolar transistor;

a first P-channel FET and N-channel FET pair of transistors, each FET having a gate electrode and a channel, the channel of the P-channel FET connected between the source of positive supply voltage and the output signal terminal, the channel of the N-channel FET connected between the source of negative supply voltage and the output signal terminal; and means coupling the input signal terminal to the gate electrodes of the first FET pair to operate the channels of the first FET pair in push-pull conduction to condition the channel of the P-channel FET for substantially simultaneous conductivity when the principal conduction path of the first bipolar transistor is conductive and to condition the channel of the N-channel FET for substantially simultaneous conductivity when the principal conduction path of the second bipolar transistor is conductive.

2. The amplifier of claim 1, wherein:

the first bipolar transistor is a PNP transistor with the first and second electrode thereof corresponding to emitter and collector electrodes respectively, the emitter electrode connected to the source of positive supply voltage and the collector electrode connected to the output terminal;

the second bipolar transistor is an NPN type transistor with the first and second electrodes thereof corresponding to emitter and collector electrodes respectively, the collector electrode connected to the output terminal and the emitter electrode connected to the source of negative supply voltage; and the gate electrodes of both FET's are connected together.

3. The amplifier of claim 2 further comprising:

a second P-channel and N-channel FET pair of transistors, each FET having a gate electrode and a channel, the channel of the P-channel FET connected between the source of positive supply voltage and the interconnected gate electrodes of the first FET pair, the channel of the N-channel FET connected between the source of negative supply voltage and the interconnected gate electrodes of the first FET pair; and means connecting the gate electrodes of the second FET pair together and directly to the input signal terminal.

4. The amplifier of claim 3 wherein the first inverter means comprises:

a P-channel FET and an N-channel FET;

each first inverter FET having a gate electrode and a channel, the channel of the P-channel FET connected between a source of positive supply voltage and the base electrode of the first bipolar transistor, the channel of the N-channel FET connected between the base of the first bipolar transistor and the source of negative supply voltage;

the gate electrodes of each first inverter FET connected together and to the input signal terminal; and the channel width-to-length ratio of the P-channel and N-channel first inverter FET's producing a relatively large-drain-current-versus-source-to-gate potential characteristic in the P-channel FET and a relatively small-drain-current-versus-source-to-gate potential characteristic in the N-channel FET to switch the first bipolar transistor off at a relatively rapid rate in response to negative-going signals at the input terminal and to switch the first bipolar transistor on at a relatively slower rate in response to a positive-going signal at the input signal terminal.

5. The amplifier of claim 3 wherein the second inverter means comprises:

a P-channel FET and an N-channel FET, each second inverter FET having a gate electrode and a channel, the channel of the P-channel second inverter FET connected between the source of positive supply voltage and the base electrode of the second bipolar transistor, the channel of the N-channel second inverter FET connected between the base electrode of the second bipolar transistor and the source of negative supply voltage;

the gate electrodes of each second inverter FET connected together and to the input signal terminal; and the channel width-to-length ratio of the P-channel to the N-channel of the second inverter FET chosen for relatively small-drain-current-versus-source-to-gate potential characteristics in the P-channel FET and a relatively large-drain-current-versus-source-to-gate potential characteristic in the N-channel FET to switch the second bipolar transistor off at a relatively rapid rate in response to positive-going signals at the input signal terminal and to switch the second bipolar transistor on at a slower rate in response to negative-going signals at the input signal terminal.

6. The amplifier of claim 1, wherein:

the first bipolar transistor is a PNP transistor with the first and second electrodes thereof corresponding to emitter and collector electrodes respectively, the emitter electrode connected to the source of positive supply voltage and the collector electrode connected to the output terminal;

the second bipolar transistor is an NPN type transistor with the first and second electrodes thereof corresponding to emitter and collector electrodes respectively, the emitter electrode connected to the source of negative supply voltage and the collector electrode connected to the output terminal;

a first resistor is included in a connection of the gate electrode of the P-channel FET to the base of the first bipolar transistor; and a second resistor is included in a connection of the gate electrode of the N-channel FET to the base electrode of the second bipolar transistor.

7. The amplifier of claim 6 wherein the first inverter means comprises:
a P-channel FET and an N-channel FET;
each first inverter FET having a gate electrode and a channel, the channel of the P-channel first inverter FET connected between the source of positive supply voltage and the gate electrode of the P-channel FET of the FET pair, the channel of the N-channel first invertor FET connected between the source of negative supply voltage and the gate electrode of the P-channel FET of the FET pair;
the gate electrodes of each first inverter FET connected together and to the input signal terminal; and
the channel width-to-length ratio of the P-channel and N-channel first inverter FET's producing a relatively large-drain-current-versus-source-to-gate potential characteristic in the P-channel FET and a relatively small-drain-current-versus-source-go-gate potential characteristic in the N-channel FET to switch the first bipolar transistor off at a relatively rapid rate in response to negative-going signals at the input terminal and to switch the first bipolar transistor on at a relatively slower rate in response to a positive-going signal at the input signal terminal.

8. The amplifier of claim 6 wherein the second inverter means comprises:
a P-channel FET and an N-channel FET;
each second inverter FET having a gate electrode and a channel, the channel of the P-channel second inverter FET connected between the source of positive supply voltage and the gate electrode of the N-channel of the FET pair, the channel of the N-channel second inverter FET connected between the source of negative supply voltage and gate electrode of the N-channel FET of the FET pair;
the gate electrodes of each second inverter FET connected together and to the input signal terminal;
the channel width-to-length ratio of the P-channel and N-channel second inverter FET's producing a relatively small-drain-current-versus-source-to-gate potential characteristics in the P-channel FET and a relatively large-drain-current-versus-source-to-gate potential characteristic in the N-channel FET to switch the second bipolar transistor off at a relatively rapid rate in response to positive-going signals at the input signal terminal and to switch the second bipolar transistor on at a slower rate in response to negative-going signals at the input signal terminal.

9. The amplifier of claim 1, wherein:
the first bipolar transistor is an NPN transistor with the first and second electrodes thereof corresponding to collector and emitter electrodes respectively, the collector electrode connected to the source of positive supply voltage and the emitter electrode connected to the output terminal;
the second bipolar transistor is a PNP type transistor with the first and second electrode thereof corresponding to collector and emitter electrodes respectively, the collector electrode connected to the source of negative supply voltage and the emitter electrode connected to the output terminal; and
the gate electrodes of both FET's are connected together.

10. The amplifier of claim 9 wherein the first inverter means comprises:
a P-channel FET and an N-channel FET;
each first inverter FET having a gate electrode and a channel, the channel of the P-channel FET connected between a source of positive supply voltage and the base electrode of the first bipolar transistor, the channel of the N-channel FET connected between the base of the first bipolar transistor and the source of negative supply voltage;
the gate electrodes of each FET connected together and to the input signal terminal; and
the channel width-to-length ratio of the P-channel and N-channel FET's producing a relatively small-drain-current-versus-source-to-gate potential characteristic in the P-channel FET and a relatively large-drain-current-versus-source-to-gate characteristic in the N-channel FET to switch the first bipolar transistor off at a relatively rapid rate in response to positive-going signals at the input terminal and switch the first bipolar transistor on at a relatively slower rate in response to a negative-going signal at the input signal terminal.

11. The amplifier of claim 9 wherein the second inverter means comprises:
a P-channel FET and an N-channel FET;
each second inverter FET having a gate electrode and a channel, the channel of the P-channel second inverter FET connected between the source of positive supply voltage and the base electrode of the second bipolar transistor, the channel of the N-channel second inverter FET connected between the base electrode of the second bipolar transistor and the source of negative supply voltage;
the gate electrodes of each second inverter FET connected together and to the input signal terminal;
the channel width-to-length ratio of the P-channel and N-channel second inverter FET's producing a relatively large-drain-current-versus-source-to-gate potential characteristic in the P-channel FET and a relatively small-drain-current-versus-source-to-gate potential characteristic in the N-channel FET to switch the second bipolar transistor off at a relatively rapid rate in response to negative-going signals at the input signal terminal and to switch the second bipolar transistor on at a slower rate in response to positive-going signals at the input signal terminal.

12. A complementary-symmetry amplifier comprising:
a first voltage source;
a second voltage source;
an input terminal for receiving an input signal potential which alternates between first and second levels, which first level is closer to the potential of the first voltage source than the potential of the second voltage source, and which second level is closer to the potential of the second voltage source than the potential of the first voltage source;
an output terminal;
first and second inverter means, each having a respective input connection to which the input terminal connects for applying the input signal potential thereto, each having a respective first power supply connection connected to the first voltage source, each having a respective second power supply connection connected to the second voltage source, each having a respective output connection at which appears respective potentials substantially equal to that of the first voltage source responsive to the second level of the input signal potential and substantially equal to that of the second voltage source responsive to the first level of the input signal potential;

a bipolar transistor having a base electrode to which the output connection of the first inverter means is connected, having an emitter electrode connected to the first voltage source, having a collector electrode connected to the output terminal, and being of a conductivity type switched into conduction whenever the potential at the output connection of the first inverter means is substantially equal to that of the second voltage source in response to the first level of the input signal potential, for relatively rapidly pulling the potential at the output terminal towards the potential at its emitter electrode; and an enhancement-mode FET having a gate electrode to which the output connection of the second inverter means is connected, having a source electrode connected to the first voltage source, having a drain electrode connected to the output terminal, and being of a conductivity type switched into conduction whenever the potential at the output connection of the second inverter means is substantially equal to that of the second voltage source in response to the first level of the input signal potential, for pulling the potential at the output terminal to a potential substantially the same as the potential at its source electrode.

* * * * *